US010785859B2

(12) United States Patent
Loertscher et al.

(10) Patent No.: US 10,785,859 B2
(45) Date of Patent: Sep. 22, 2020

(54) GENERATING EXTREME ULTRAVIOLET RADIATION WITH NANOSCALE ANTENNAS

(71) Applicant: International Business Machines Corporation, Armonk, NY (US)

(72) Inventors: Emanuel Loertscher, Bonstetten (CH); Andrea Giovannini, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/226,565

(22) Filed: Dec. 19, 2018

(65) Prior Publication Data

US 2020/0205276 A1 Jun. 25, 2020

(51) Int. Cl.
*H05G 2/00* (2006.01)
*G03F 7/20* (2006.01)
*B82Y 10/00* (2011.01)

(52) U.S. Cl.
CPC .......... *H05G 2/008* (2013.01); *G03F 7/70033* (2013.01); *H05G 2/005* (2013.01); *B82Y 10/00* (2013.01)

(58) Field of Classification Search
CPC .......... H05G 2/00; H05G 2/001; H05G 2/003; H05G 2/005; H05G 2/008

(Continued)

(56) References Cited

U.S. PATENT DOCUMENTS 9,496,681 B2    11/2016  Vampa et al.
2006/0186356 A1*  8/2006  Imai .................... G03F 7/70916
                                                        250/504 R (Continued)

FOREIGN PATENT DOCUMENTS

CN            103138149 A      5/2013

OTHER PUBLICATIONS

Ohashi, et al. (2014). Tuning extreme ultraviolet emission for optimum coupling with multilayer mirrors for future ithography through control of ionic charge states. Journal of Applied Physics, 115(3), 033302-1 Through 033302-5 Plus Cover.

(Continued)

*Primary Examiner* — Jason L Mccormack
(74) *Attorney, Agent, or Firm* — Daniel Morris; Otterstedt, Wallace & Kammer, LLP

(57) ABSTRACT

A method for generating extreme ultraviolet (EUV) radiation employs an EUV apparatus, which comprises one or more sets of nanoscale antennas, designed for electromagnetic field enhancement. The one or more sets comprise, each, at least one pair of opposite antennas separated by a feedgap volume. First cations of same molecular entities are allowed to reach the feedgap volumes and the antennas are energized so as to perform one or more EUV radiation emission cycles, during which the first cations are further ionized via electromagnetic field intensities achieved in the feedgap volumes by optically exciting corresponding pairs of opposite antennas. Second cations are thus obtained, which have a higher charge state than the first cations, and are forced to radiatively decay, by electrically stimulating antenna pairs, whereby EUV radiation is generated and third cations are obtained, which have a lower charge state than the second cations.

25 Claims, 6 Drawing Sheets

(58) Field of Classification Search
USPC .................................................. 250/504 R
See application file for complete search history.

(56) References Cited

U.S. PATENT DOCUMENTS

| | | |
|---|---|---|
| 2013/0077073 A1 | 3/2013 | Van Schoot et al. |
| 2014/0264089 A1 | 9/2014 | Kim et al. |
| 2017/0181258 A1 | 6/2017 | Ershov |
| 2018/0057930 A1 | 3/2018 | Loertscher et al. |

OTHER PUBLICATIONS

Pfullmann, et al. (2013). Bow-tie nano-antenna assisted generation of extreme ultraviolet radiation. New journal of Physics, 15(9), 093027 pp. 1-25.

Kim, et al. (2008). High-harmonic generation by resonant plasmon field enhancement. Nature, 453(7196), 757-760.

Cynthia Gruber et al. unpublished U.S. Appl. No. 15/681,371 filed Aug. 19, 2017, "Optical Sensing Device With Multiple Field-Enhanced Nano-Volumes," pp. 1-37 plus 7 sheets drawings.

* cited by examiner

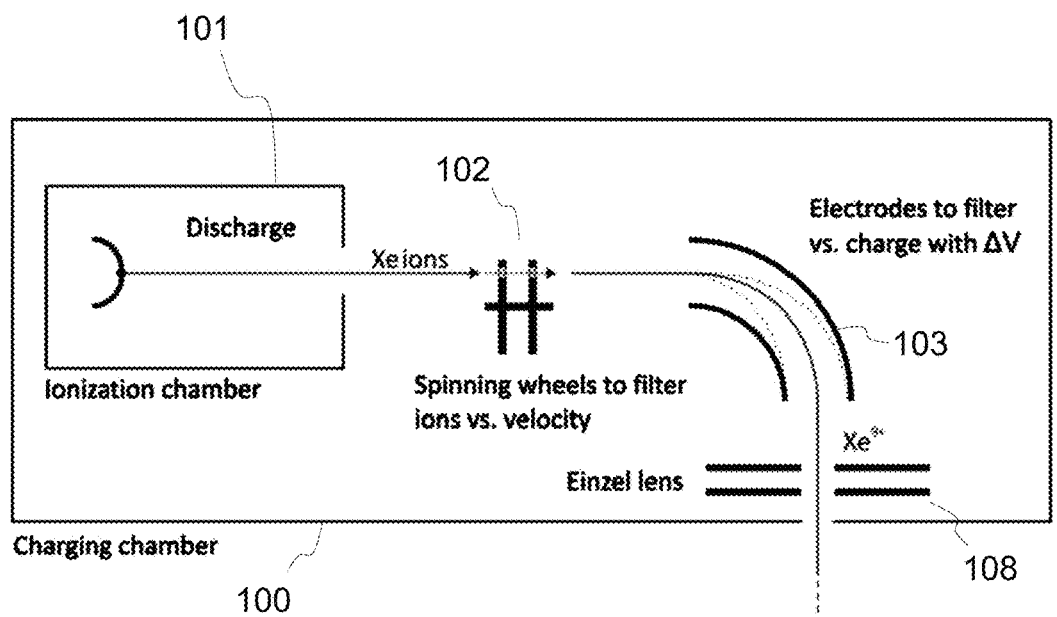
FIG. 4A
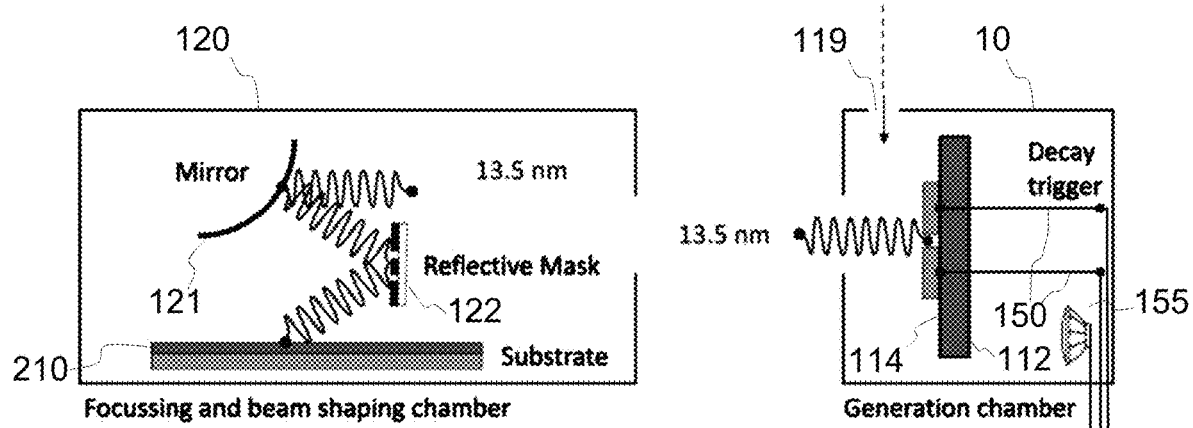
FIG. 4C
FIG. 4B

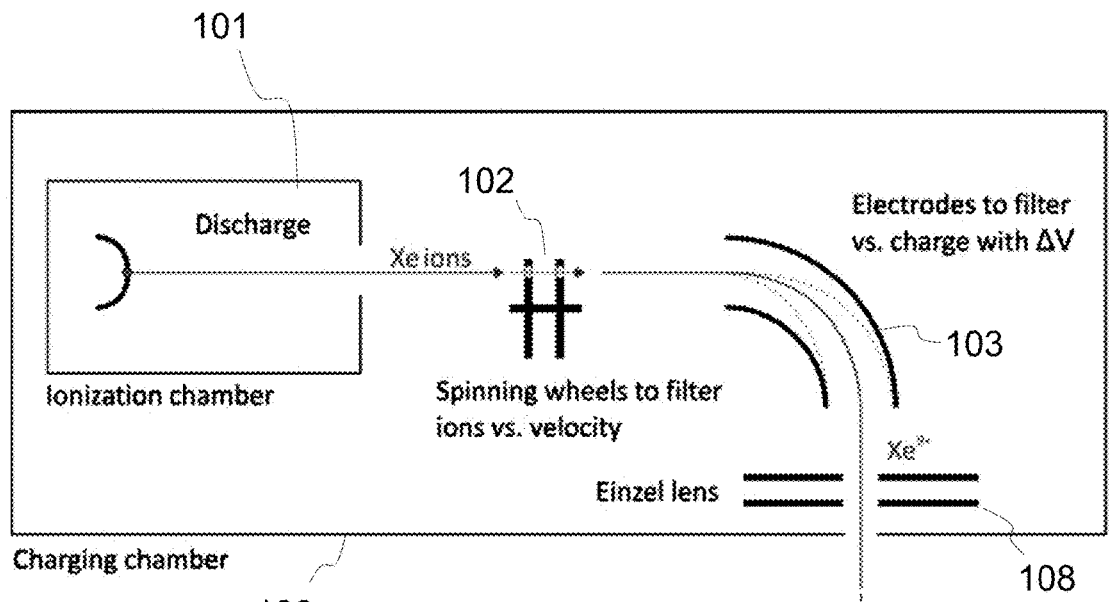
FIG. 5A
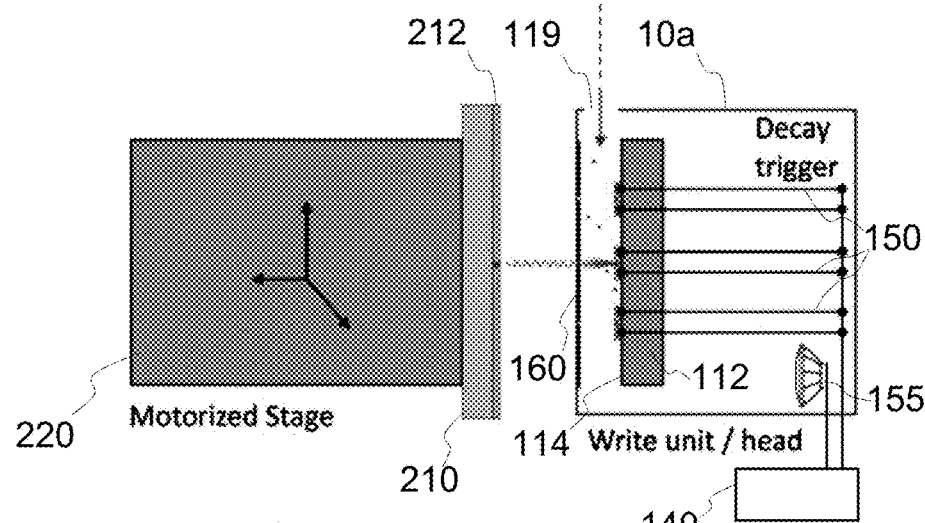
FIG. 5C
FIG. 5B

GENERATING EXTREME ULTRAVIOLET RADIATION WITH NANOSCALE ANTENNAS

BACKGROUND

The invention relates in general to techniques for generating extreme ultraviolet (EUV) radiation, e.g., for semiconductor lithography applications. In particular, it is directed to methods and apparatuses for generating EUV radiations with nanoscale antennas designed for electromagnetic field enhancement and electrical biasing.

Complementary Metal-Oxide Semiconductor (CMOS) technology has been the predominant electronic approach for the last five decades. Performance increase was primarily because of the size reduction of the main components enabled by lithographic advances. Nowadays, however, miniaturization has slowed down because integration densities of transistors start causing unbearable thermal loads, which deteriorate the device performance. In addition, manufacturing costs are becoming unaffordable. While novel architectures in combination with direct and local cooling approaches may help to circumvent the first obstacle, no convincing solution to the increase in the manufacture costs has been proposed so far, leading to drastic margin reductions in the semiconductor industry.

Increased costs are primarily due to the lithography apparatus required to pattern structures with sub-50 nm critical dimensions, using optical light at sub-100 nm wavelengths. So far, the wavelength reductions throughout successive CMOS generations could be afforded by employing new laser sources (e.g., by replacing the 248 nm KrF excimer laser with a 193 nm ArF excimer laser) in combination with appropriate resists. However, owing to the lower wavelengths below 20 nm (e.g., 13.5 nm) as currently contemplated for the next-generation standard, there are fundamentally new challenges for future extreme-ultraviolet (EUV) lithography:

Below 20 nm, radiation is largely absorbed in air and most common materials. This requires operating the lithography systems under vacuum conditions compared to operations, which, so far, were carried out under ambient conditions;

This high absorption makes standard refractive optics (e.g., lenses) not applicable anymore. Instead, mirror optics are needed, which rely on Bragg reflection;

Masks used for patterning must be reflective in the UV range (with a reflectivity typically larger than 80%), instead of being transmissive as they currently are; and Due to Rayleigh scattering, masks, mirrors and other components must possess a surface roughness below 1 nm (ideally on the order of 0.1 nm or even less).

These requirements for reflective optics for EUV lithography have led to the use of multilayer mirrors (e.g., 100 Molybdenum/Si layers), which can only be optimized for a specific operating wavelength. The International Technology Roadmap for Semiconductors (ITRS) has proposed to use an operating wavelength of 13.5 nm to standardize EUV technology. Two main approaches are currently being developed to achieve 13.5 nm radiation: (i) the so-called gas discharge produced plasma (GDPP) and (ii) the focused laser-produced plasma (LPP). For either approach, only 1-2% of the total radiation generated lies in the desired energy range, and the remaining radiation has to be rejected or filtered out. Xe and Sn are considered as potential media for the plasma, the latter being able to reach 100 W optical flux at 13.5 nm in prototype systems.

Apart from the optical system (mirror development, mirror manufacturing, etc.) and the new masking concepts (beam shaping, exposure calculations, interference effects, etc.), current issues in EUV lithography systems are related to the EUV source itself. Such issues relate to stability, the total output power, debris and contamination of optics and masks from the EUV source. Another task concerns the development of EUV-sensitive resists allowing the required resolution to be achieved. In LPP, which is currently perceived as the most promising approach, multiple challenges still have to be solved. The stability of the droplet target is a first challenge; owing to impurities, chemical reactions and thermal load, the Sn jet is often becoming unstable both in time domain and space. This causes jittering of the EUV source and eventually sudden stopping thereof. Other important challenges include the debris generation in form of clusters, neutral atoms and fast ions. Such matter expands from the irradiation region up to the first multilayer mirror, which damages the mirror. To protect the mirror from non-matching irradiation, different techniques have been explored, which are, however, not yet able to sufficiently protect the mirror.

Once radiation is generated at the source and reflected by the first mirror, it passes through the intermediate focus (IF). At the IF, the radiation is energetically cleaned with spectral purity filters, which consist of very thin membranes (thickness of hundreds of nm). Achieving satisfactory lifetimes for such membranes is another challenge because of deposition and thermal loads. After the membrane, EUV radiation enters the illuminators; a complex system of multilayer mirrors that directs the radiation to the resist with as little as possible aberration.

As seen, several challenges have to be overcome, which make EUV lithography systems, in particular the EUV source, very complex and expensive machines. Also, additional issues in terms of scaling and throughput further have to be addressed to make EUV lithography a leading technology for CMOS manufacturing.

Accordingly, a new approach is desired to efficiently and reliably generate EUV radiation and to substitute the reflective mirror optics.

SUMMARY

According to a first aspect, the present invention is embodied as a method for generating extreme ultraviolet radiation (hereafter termed as EUV radiation). The method relies on an extreme ultraviolet radiation device (hereafter termed as EUV device), which comprises one or more sets of nanoscale antennas. The antennas are designed for electromagnetic field enhancement (FE) and electrical biasing. The one or more sets comprise, each, at least one pair of opposite antennas separated by a gap, which defines a field enhancement volume, or FE volume. The antenna sets accordingly form respective FE volumes. To start with, first cations (i.e., cations of a first type) of same molecular entities are allowed to reach the FE volumes and the one or more sets of antennas are energized so as to perform one or more EUV radiation emission cycles. During such cycles, the first cations are further ionized (i.e., to a higher charge state) thanks to electromagnetic field intensities achieved in the FE volumes by optically exciting pairs of opposite antennas corresponding to such volumes. This way, second cations (i.e., cations of a second type) are obtained, which have a higher positive charge state than the first cations. Next, the second cations are forced to radiatively decay, by electrically stimulating antenna pairs of the one or more sets of antennas, whereby EUV radiation is generated. Consequently, third cations (i.e., cations of a third type) are obtained, which have a lower charge state than the second cations.

The present approach makes it possible to controllably generate EUV radiation, based on FE antennas. This innovative approach solves scalability issues with current EUV sources and further allows their complexity and costs to be drastically reduced. In addition, the antennas allow for local EUV radiation to deterministically expose a resist without the need of masks for patterning.

In embodiments, the first cations are allowed to reach the FE volumes and the one or more sets of antennas are energized so as to perform several EUV radiation emission cycles.

Preferably, allowing the first cations to reach the FE volumes further comprises, during one or each of the cycles, trapping the first cations in the FE volumes, thanks to (high) electromagnetic field intensities and (large) field gradients achieved in the FE volumes by optically exciting corresponding pairs of opposite antennas. This is carried out in such a way that, subsequently, the first cations are further ionized, and the second cations are forced to decay while being trapped in the FE volumes. The trapping of the chemical species improves the stability of the process as excitation and decay is coherently done on the same ions, and, in turn, improves the resulting EUV emission.

In preferred embodiments, the method further comprises, during one (or each) of the EUV radiation generation cycles and after having forced the second cations to radiatively decay in said one (or each) of the cycles, releasing the third cations (which, so far, were still trapped in the FE volumes) for them to be able to potentially reach any of the feedgap volumes, in view of a next one of the cycles.

In variants, the second cations are forced to radiatively decay, so as to obtain third cations that have a same charge state as the first cations. There, the method further comprises, during one (or each) of the cycles and after having forced the second cations to radiatively decay in said one of the cycles, maintaining the third cations in the FE volumes, in order to start a next EUV radiation generating cycle.

In embodiments, the forced decay is achieved by applying or modifying a voltage bias between opposite antennas of at least one of the one or more sets, so as to quantum mechanically tunnel one or more electrons across each gap of one of the one or more sets of antennas (which gap defines a corresponding FE volume) and thereby trigger a radiative decay of the second cations. E.g., quantum tunneling electrons allows one or more electrons to be "added" into the FE volumes, thereby forcing the ionized species to decay.

Preferably, the forced decay is achieved by applying or modifying the voltage bias in a pulsed operating mode, whereby the voltage bias is applied or modified synchronously with a pulsed optical excitation to ionize the cations (i.e., at a given time after having applied the optical pulse, during each cycle), the voltage bias being otherwise simultaneously applied or modified across the sets of antennas. Relying on a pulsed, synchronous operating mode such as described above further makes it possible to improve the stability (in time) of the emission, a thing that can advantageously be exploited in applications such as semiconductor lithography.

The optical excitation and the electrically triggered decay may possibly be restrictively applied only to a subset of the sets of antennas, so as to generate a spatially variable EUV radiation pattern.

In preferred embodiments, the method further comprises generating the first cations and allowing the generated cations to reach a surface of the device, on which the one or more sets of antennas are arranged, in view of allowing the first cations to reach the FE volumes.

Preferably, the first cations comprise one of $Xe^{p+}$ and $Sn^{q+}$ ions, where $5 \leq p \leq 11$ and $7 \leq q \leq 12$.

In embodiments, the first cations are further ionized by optically exciting pairs of opposite antennas so as for the positive charge of the second cations obtained to exceed a positive charge of the first cations by one, and the second cations are further forced to radiatively decay so as to obtain third cations that have a same positive charge as the first cations.

Preferably, the first cations essentially comprise $Xe^{9+}$ ions. During each of the cycles, pairs of opposite antennas are optically excited such that the second cations obtained essentially comprise $Xe^{10+}$ ions, and the second cations are forced to radiatively decay essentially into $Xe^{9+}$ ions, so as to generate an EUV radiation having an average wavelength of 13.5 nm.

In preferred embodiments, in the EUV device provided, the sets of nanoscale antennas comprise, each, two pairs of opposite antennas, wherein the two pairs define a single FE volume. I.e., a single FE volume is defined at an end of the antennas of the two pairs.

Preferably, during each of the cycles, the first cations are further ionized by optically exciting antennas of said two pairs of antennas, whereas the second cations are forced to radiatively decay by electrically stimulating antennas of only one of said two pairs.

In embodiments, the method further comprises directing EUV radiation generated during said one of the cycles to a given part of a UV-sensitive surface to pattern the latter, which completes one of the cycles.

In embodiments, the one or more sets of antennas are optically excited to ionize the first cations, while only a subset of antennas is then electrically biased to force radiative decay, thereby creating a spatial modular EUV radiation pattern, exposing only subsection of the UV-sensitive surface.

Preferably, the one or more sets of antennas are energized so as to perform several EUV radiation emission cycles (e.g., to create different doses per pixel), and the method further comprises (upon completing a cycle) moving the EUV device with respect to said UV-sensitive surface and directing EUV radiation generated during a next cycle to another part of the UV-sensitive surface, in order to further pattern the latter, e.g., to create a topology of surface doses of EUV radiation According to another aspect, the invention is embodied as an extreme ultraviolet radiation apparatus, or EUV apparatus. The apparatus comprises one or more sets of nanoscale antennas (again designed for electromagnetic field enhancement and, e.g., electrical biasing). The antenna sets comprise, each, at least one pair of opposite antennas separated by a gap defining a FE volume, thereby forming one or more FE volumes for the one or more sets, respectively. The apparatus further includes a charging chamber system, configured to allow first cations of same molecular entities to reach the FE volumes (e.g., while filtering out other types of cations with different charge state), and a dual energization unit. The latter is coupled to the sets of antennas and configured to energize such sets of antennas, so as to be able to perform one or more EUV radiation emission cycles as evoked above in reference to the present methods.

Preferably, the EUV apparatus further comprises a support structure, on a surface of which the one or more sets of nanoscale antennas are arranged. The support structure is designed so as for it to be essentially permissive to an electromagnetic field applied therethrough (to further ionize the first cations in the FE volumes) and essentially reflecting the EUV radiation generated (e.g., unidirectionally), in operation.

In embodiments, the apparatus further includes a light source adapted to emit visible light (typically between 450 and 750 nm), and the support structure includes a layer stack of materials selected so as for the support structure to be essentially permissive to such visible light (in order to be able to optically excite the antennas, which in turn, further ionizes the first cations in the FE volumes), while essentially reflecting EUV radiation generated, in operation. The EUV radiation generated typically has an average wavelength that is less than 100 nm, in operation.

Preferably, the apparatus further comprises an electrical circuit coupling the energization unit to opposite antennas of each of the one or more sets, this electrical circuit being at least partly buried in the support structure, such that the second cations can be forced to radiatively decay by applying or modifying (via the energization unit and the electrical circuit) a voltage bias between opposite antennas of at least one of the one or more sets, so as to tunnel one or more electrons through the corresponding FE volumes and thereby trigger a radiative decay of the second cations, in operation.

In preferred embodiments, said electrical circuit includes one or more redistribution layers buried in the support structure.

Preferably, the charging system comprises an ionization chamber designed to generate the first cations, the charging system being otherwise configured with respect to the surface of the support structure to allow first cations generated with the charging system to reach said surface.

In embodiments, the apparatus comprises several of said sets of nanoscale antennas, the sets distributed on the surface of a support structure of the apparatus.

Preferably, in the EUV apparatus provided, at least some of the sets of nanoscale antennas comprise, each, two pairs of opposite antennas, wherein the two pairs define a single FE volume, and the energization unit is, on the one hand, coupled to one of the two pairs of antennas of each of the sets, so as to be able to further ionize the first cations by optically exciting said one of the two pairs and, on the other hand, coupled to another one of the two pairs of antennas of each of the sets, so as to force the second cations to radiatively decay by electrically stimulating opposite antennas of said another one of the two pairs, in operation.

According to a final aspect, the invention is embodied as an extreme ultraviolet radiation lithography apparatus. The latter comprises an EUV radiation apparatus such as described above and a holder. The lithography apparatus is otherwise configured to direct EUV radiation generated by the EUV apparatus (during one or more of the cycles, in operation) toward the holder, so as to be able to pattern a given part of a UV-sensitive surface of a material placed in the holder, in operation.

Preferably, the lithography apparatus further comprises a shield with one or more apertures designed to spatially constrain EUV radiation directed toward the holder, in operation. The apparatus is further configured to move the holder with respect to the shield. Thus, a UV-sensitive surface may be moved with respect to the shield, so as to direct EUV radiation generated during a next cycle to another part of the UV-sensitive surface, in order to further pattern the latter, in operation.

Apparatuses and methods embodying the present invention will now be described, by way of non-limiting examples, and in reference to the accompanying drawings.

BRIEF DESCRIPTION OF THE DRAWINGS

The accompanying figures, where like reference numerals refer to identical or functionally similar elements throughout the separate views, and which together with the detailed description below are incorporated in and form part of the present specification, serve to further illustrate various embodiments and to explain various principles and advantages all in accordance with the present disclosure, in which:

FIGS. 4A, 4B, and 4C (referred to collectively as "FIG. 4") are a diagram of selected components of an EUV radiation apparatus according to embodiments;

FIGS. 5A, 5B, and 5C (referred to collectively as "FIG. 5") are a diagram of selected components of an EUV radiation lithography apparatus, as involved in embodiments;

Figure 1A:
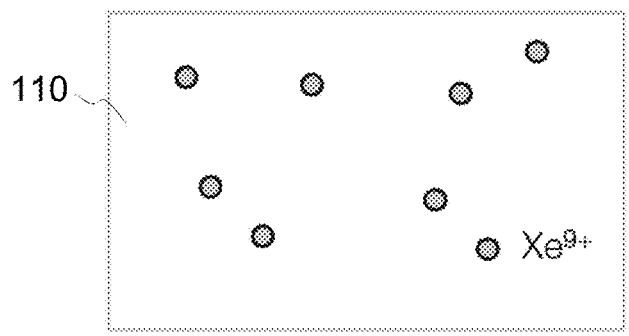
FIGS. 1A, 1B, 1C, 1D, and 1E (referred to collectively as "FIG. 1") show top views of a given set of nanoscale antennas in a sequence illustrating high-level steps of a method for generating extreme ultraviolet (EUV) radiation, according to embodiments.
Figure 1B:
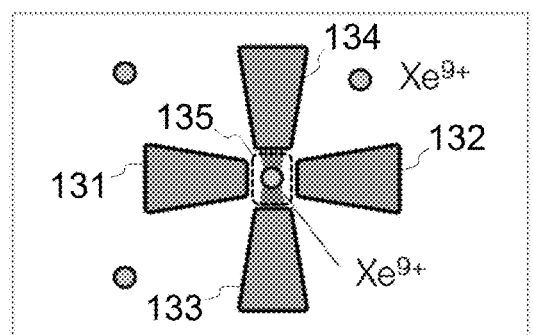

The accompanying drawings show simplified representations of devices or parts thereof, as involved in embodiments. Technical features depicted in the drawings are typically not to scale. Similar or functionally similar elements in the figures have been allocated the same numeral references, unless otherwise indicated.

DETAILED DESCRIPTION

The following description is structured as follows. First, general embodiments and high-level variants are described (sect. 1). The next section addresses more specific embodiments and technical implementation details (sect. 2).

1. General Embodiments and High-Level Variants

Figure 6:
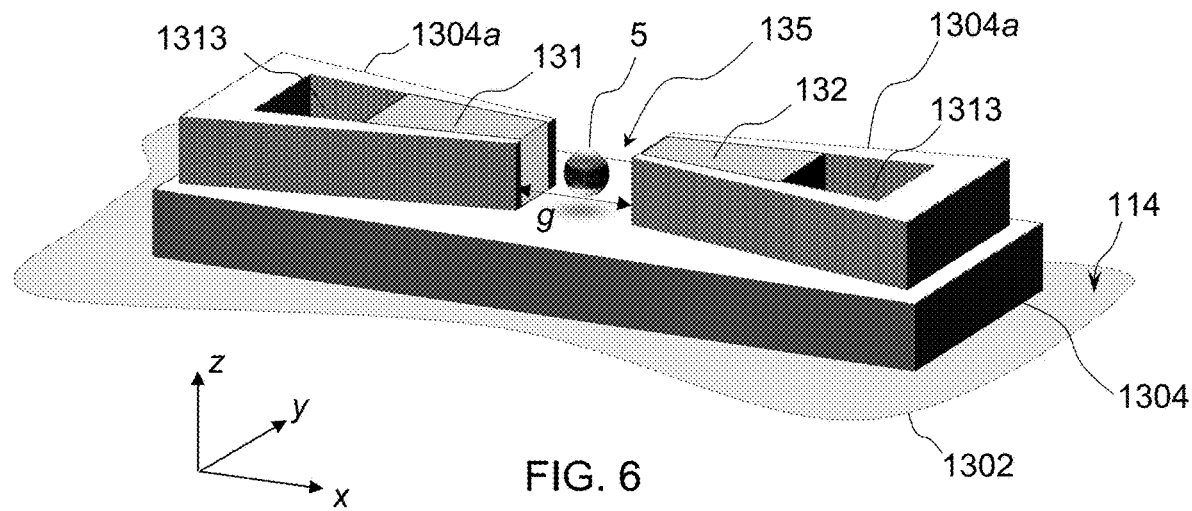
FIG. 6 is a 3D view of an antenna set comprising a single pair of nanoscale antennas, as involved in embodiments.
Figure 7:
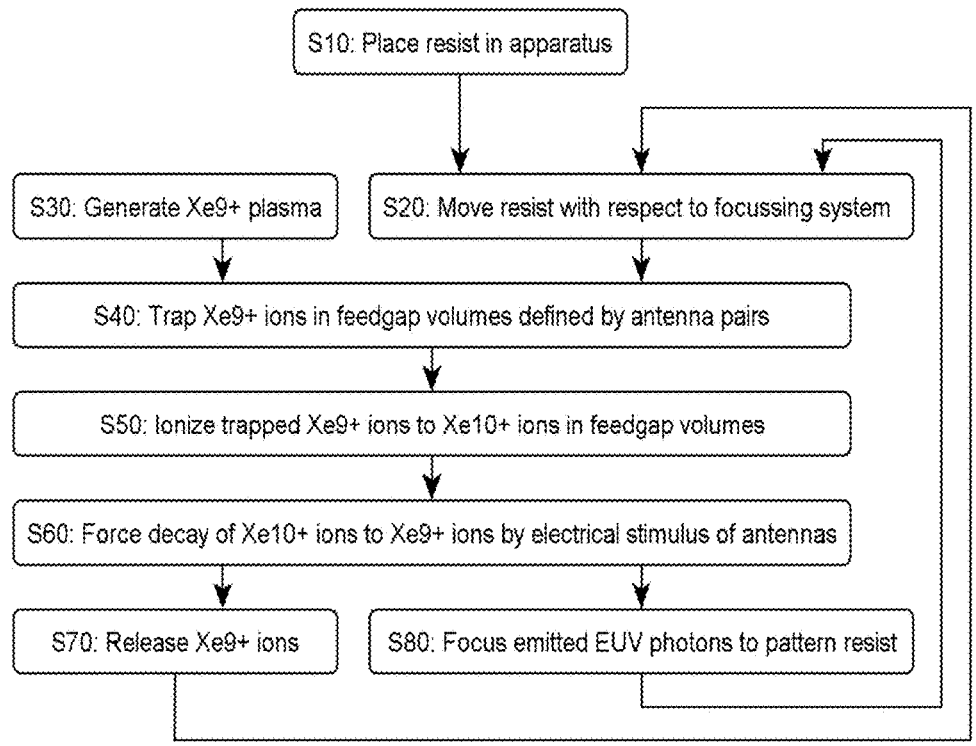
FIG. 7 is a flowchart illustrating high-level steps of a method for generating EUV radiation and pattern a UV-sensitive resist, as in embodiments.

Referring generally to FIGS. 1 to 7, an aspect of the invention is first described, which concerns a method for generating extreme ultraviolet radiation (EUV) radiation. Numeral references preceded by an "S" refers to method steps as shown in FIG. 7.

This method involves S10 an EUV device 10, 10a, which typically forms part of an apparatus 1, 1a, as latter described in reference to FIGS. 2-5. The EUV device comprises one or more sets 130 of nanoscale antennas 131-134. I.e., at least one antenna set 130 is required, although the present devices will likely include several sets of antennas, as assumed in the following.

The antennas of each set 130 are designed for electromagnetic field enhancement (FE) purposes. I.e., the sets of antennas are configured in the device so as to define a FE volume between opposite antennas of each of the sets. Electromagnetic radiation can accordingly be concentrated in each FE volume, in operation. Such antennas typically extend parallel to a surface 114 of a support structure 112 (e.g., a layer stack) of the device 10, 10a, so as to form one or more pairs of antennas in each set 130.

Note, what is here termed a "pair of antennas", like the pair of antennas 131 and 132 in FIG. 6, may also be referred to as a single antenna comprising two antenna elements. In fact, in the present technical field, such a pair of antennas is interchangeably referred to as a single antenna, a pair of antennas, a pair of antenna elements, a dimer antenna, a doublet, etc., or, still as an antenna. However, since each of the antenna elements 131, 132 may itself behave as an antenna, we choose here to refer to it as a "pair of antennas", it being understood that each pair comprises two elements, as consistently used in the following description.

Such antennas refer to an electro-magnetic device designed to receive and transmit electro-magnetic radiation ranging from the ultraviolet over the visible to the infrared frequency domain. In addition, an antenna in the present context does not necessarily need to be electrically driven or convert an incident electro-magnetic radiation into an electrical signal. Notably, such antennas can guide and concentrate electromagnetic radiation into near-field sub-diffraction volumes and couple light from the far-field into the near-field. Various antenna geometries and designs can be contemplated, as for example described in U.S. patent application Ser. Nos. 15/681,371 and 15/249,916. Preferred characteristics of the present antennas are further discussed in sect. 2.1.

The sets 130 comprise, each, at least one pair {131, 132} of opposite antennas, as assumed in the embodiments of FIGS. 2-6. In variants, at least some of the sets may include, each, two or more pairs of antennas. For instance, the set 130 depicted in the sequence of FIG. 1 includes two pairs {131, 132}, {133, 134} of antennas, for reasons that will become apparent later. In all cases, antennas of each set 130 are separated by a gap g, which defines a FE volume 135. The antenna sets accordingly form respective FE volumes 135.

According to the present method, cations of same molecular entities (hereafter referred to as "first cations") are allowed S30, S40 to reach the FE volumes 135 defined between opposite antennas of the sets 130 (see FIGS. 1A, 1B) and, this, prior to or during each of the cycles. The antenna sets 130 are concomitantly or subsequently energized S40-S60, so as to perform one or more EUV radiation emission cycles S20-S60.

Figure 1C:
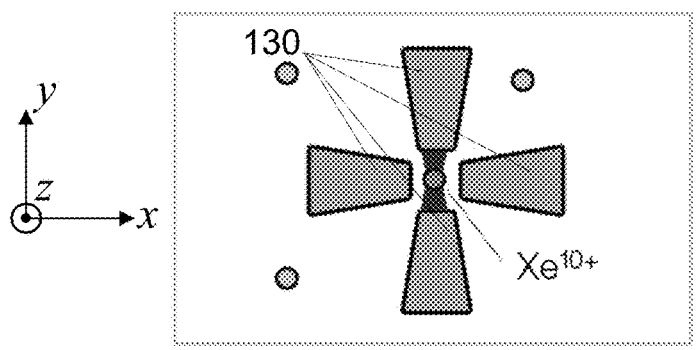
Figure 1D:
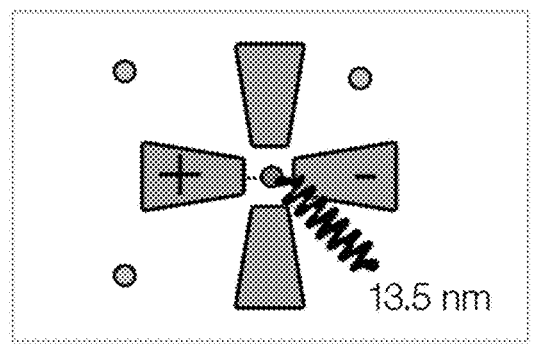
Figure 1E:
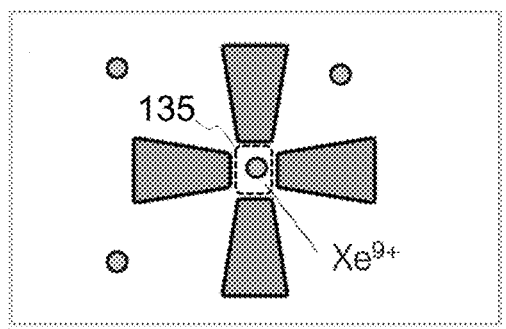

During such cycles, the first cations (e.g., $Xe^{9+}$) are further ionized S50, thanks to the field enhancement achieved in each of the FE volumes 135, which gives rise to high filed intensities in such volumes 135, as illustrated in FIG. 1C. This is achieved by optically exciting pairs of opposite antennas (as depicted for pair {133, 134} in FIG. 1C). Second cations are accordingly obtained (e.g., $Xe^{10+}$), which have a higher charge state than the first cations. Next, the second cations obtained are forced S60 to radiatively decay (FIG. 1D) and third cations (e.g., again $Xe^{9+}$) are accordingly obtained (FIG. 1E), which have a lower charge state than the second cations. The forced decay is achieved by electrically stimulating antenna pairs (e.g., the pair {131, 132} in FIG. 1) of the sets 130, e.g., by applying a bias between two antennas pairs. The radiative decay generates the desired EUV radiation (FIG. 1D).

Note, cations are molecular entities, i.e., atomic or molecular ions. The cations initially introduced in the FE volumes 135 (i.e., the first cations) preferably have all a same ionized state (e.g., $Xe^{9+}$), so as to perform S50 similar transitions throughout the sets 130 and eventually obtain S60 a narrower EUV emission spectrum. Note, the instability of negative ions would likely be an issue, in particular to extract photons with energies at EUV level, whence the need to rely on cations.

The present approach makes it possible to controllably generate EUV radiation, based on nanoscale FE antennas. This innovative approach is power efficient and solves scalability issues with current EUV sources. It further allows their complexity and costs to be reduced, as discussed in detail in sections 2.2 and 2.3.

The extreme ultraviolet radiation (also called high-energy ultraviolet radiation) as eventually generated S60 comprises electromagnetic radiation having wavelengths between 10 nm and 124 nm. In the present case, however, the cations generated S30 shall preferably be such that the subsequently forced S60 decay generates EUV radiation having an average wavelength of less than 100 nm. More preferably, the system may be designed so as for the radiative decay to generates radiation at wavelengths of less than 50 nm, or even less 30 nm. This radiation may for instance be narrowly distributed around the target wavelength, e.g., 13.5 nm as needed in applications to semiconductor lithography (which now requires EUV radiation at 13.5 nm and below). However, it is equally difficulty to reliably generate radiation at higher wavelengths in the EUV range, whence the potential benefits of the present approach, which may be used to achieve any EUV wavelength.

Preferably, several EUV radiation emission cycles are performed. That is, the first cations are allowed S30-S40 to reach the FE volumes 135 and the antenna sets 130 are dually energized S40-S60 so as to perform several emission cycles. Steps S30-S40 may notably involve a step of trapping S40 the first cations in the FE volumes 135. This can be achieved thanks to electromagnetic field intensities and field gradients obtained in the FE volumes 135, i.e., by optically exciting pairs of opposite antennas. Interestingly, the cations can subsequently be further ionized S50 and forced S60 to decay while still being trapped in the volumes 135. The trapping of ionized species in the FE volumes is achieved thanks to optical or electro-magnetic forces generated by coupling electromagnetic radiation into the antennas.

The trapping of the chemical species improves the stability of the process and, in turn, improves the resulting EUV emission. Still, trapping the species is not necessarily required as the ionization and decay are typically fast processes. The trapping process S40 may be performed once, in view of performing several emission cycles (cations remain trapped during each subsequent cycles), or during one or each of the cycles (cations are released at the end of the cycle), as discussed now.

Namely, in a first class of methods, the third cations are released S70 in the chamber 10, 10a during one or each cycle, after having forced S60 the second cations to radiatively decay. Once released, the cations are again available to potentially reach any FE volume, in view of a next cycle. Releasing the cations makes it possible to improve the statistical distribution of cations in the feedback volumes, throughout the EUV emission cycles.

In variants (second class of methods, not shown in FIG. 7), the third cations are maintained in the FE volumes 135 (i.e., during one or each cycle, after the forced decay S60), in order to start a next cycle. This variant allows shorter cycles and thus a larger photon flux. This, however, requires obtaining third cations that have the same charge state as the first cations.

As said, step S60 is performed suitably stimulating (electrically speaking) opposite antennas of the sets 130. This may for instance simply be achieved by applying a voltage bias between opposite antennas, e.g., the pair {131, 132} in the example of FIG. 1D. This, in turn, causes one or more electrons to quantum mechanically tunnel across each of the corresponding FE volumes 135 and thereby triggers a radiative decay of the second cations. Still, since opposite pairs of antennas may need be subject to a continuous bias (throughout the cycles), step S60 may instead require modifying a previously applied bias to trigger the electron tunneling process. In all cases, a distinct energization scheme is now relied upon (compared to the optical excitations involved at steps S40 and S50), which triggers a quantum tunneling process between antenna halves of at least some of the sets 130. The electron tunneling process allows electrons to be "added" into the feedback volumes 135, which, in turn, triggers the radiative decay in the EUV source by a transition from one charge state to another one. As one understands, the underlying EUV device must accordingly be configured to allow a dual energization scheme, allowing both an optical excitation and an electrical stimulation of antennas of the sets 130. Such mechanisms (optical excitation and electrical stimulation) are sufficiently disentangled to be triggered individually.

Preferably, the electrical stimulation S60 is performed according to a pulsed operating mode, which is synchronous with the optical excitation, through several or all of the antenna sets 130. That is, the second cations may possibly be forced S60 to radiatively decay by simultaneously (or at least concomitantly) applying or modifying a voltage bias between opposite antennas of two or more of the sets 130 of antennas, during each cycle, and at a given, predetermined time after having applied the optical pulse. Relying on a pulsed (synchronous) operating mode makes it possible to improve the stability in time of the EUV emission, a thing that can advantageously be exploited in applications such as semiconductor lithography.

The present methods may further comprise steps to controllably generate S30 the first cations and further allow the generated cations to reach a surface 114 of the device 10, 10a, on which the sets 130 of antennas are arranged. Such steps are carried out in view of allowing the first cations to reach S40 the FE volumes 135. To that aim, the device 10, 10a will typically form part of an apparatus 1, 1a that includes a charging chamber system 100 with an ionization chamber 101 and an ion focusing system 102, 103, 108, as schematically depicted in FIGS. 4 and 5. How ions are generated and then guided toward the surface 114 is discussed in detail in sect. 2.1.

Various types of cations can be contemplated. Preferably though, the first cations generated S30 comprise $Xe^{p+}$ or $Sn^{q+}$ ions. The charge state of the first cations generated S30 impacts the subsequent radiation emission S60. Since the desired radiation is in the EUV range, p and q will normally be chosen such that $5 \leq p \leq 11$ and $7 \leq q \leq 12$. Still, use is more preferably made of $Xe^{p+}$ ions, for reasons discussed later. In variants, other noble gases may be relied on. Further variants may for example use $SF_6$ molecules, which can be dissociated to produce $F^{r+}$ ions, as known per se. More generally, the mean charge state of the first cations generated S30 should be such that a further ionized version of that ion (as obtained at step S50) may, on recombining with one or more electrons, cause the emission of a photon in the desired wavelength band. Much preferred, however, is to rely on a recombination process S60 involving only a single electron (e.g., $Xe^{10+}+e^- \rightarrow Xe^{9+}$), so as to narrow down the width of the spectrum of emitted radiation and make the recombination process more efficient.

Likewise, the charge state difference between the first and second cations shall preferably be minimal, e.g., of only one. For instance, the first cations may be further ionized S50 by optically exciting pairs {131-134} of antennas so as for the positive charge of the second cations to exceed the charge state of the first cations by one only (e.g., $Xe^{9+} \rightarrow Xe^{10+}+e^-$). The second cations obtained S50 may subsequently be forced S60 to radiatively decay by tunneling one electron only in each FE volume 135, such that the third cations obtained have the same charge as the first cations. For example, the first cations may essentially comprise $Xe^{9+}$ ions, whereby the second cations obtained essentially comprise $Xe^{9+}$ ions, which are subsequently forced S60 to decay into $Xe^{9+}$ ions and, this, during each cycle. This results in emitting EUV radiation at 13.5 nm, as desired in applications to semiconductor lithography.

Each set 130 includes at least one pair of opposite antennas, as assumed in FIGS. 2-5. In variants, however, the EUV device 10, 10a may include sets 130 of nanoscale antennas 131-134 that comprise, each, two pairs {131, 132}, {133, 134} of opposite antennas, wherein the two pairs define a single FE volume 135. E.g., longitudinal antenna elements may point at and be separated by a single FE volume, as in FIG. 1. Increasing the number of pairs of antennas per set 130 allows additional flexibility in the optical S40, S50 and electrical S60 coupling schemes. For example, first cations may be further ionized S50 by optically exciting all pairs of antennas {131-134} of antennas, whereas second cations may be forced S60 to radiatively decay by electrically stimulating antennas of a given pair only {131, 132}, at each cycle.

Several EUV radiation emission cycles shall typically be performed. Upon completing a cycle, EUV radiation generated S60 during this cycle may for example be directed S80 to a given target 210-212, e.g., a part of a UV-sensitive surface 212 to pattern the latter, as illustrated in FIGS. 4 and 5. Upon completing a cycle, the target surface 212 may then possibly be moved S20 with respect to the EUV device 10a, so as to direct S80 EUV radiation generated during a next cycle to another part of the target surface 212 and further pattern the latter. This assumes that the target surface is arranged on a movable stage (as in FIGS. 3, 5) or, more generally, that the system is otherwise configured so as for the EUV source (or a part thereof) to be controllably movable relatively to the target surface 212.

In that respect, another aspect of the invention is now discussed in reference to FIGS. 2-5, which concerns an EUV radiation apparatus 1, 1a. Essential aspects of this apparatus have already been implicitly addressed in respect of the present methods and are only briefly discussed here.

As evoked earlier, this apparatus 1, 1a comprises one or more sets 130 of nanoscale, FE-enhancement antennas 131-134, wherein each set 130 comprises at least one pair of opposite antennas separated by a FE volume 135.

In addition, the apparatus 1, 1a includes a charging chamber system 100. The latter is generally configured to allow first cations of same molecular entities to be generated S30 and reach S40 the FE volumes 135 defined by antenna sets 130. As seen in FIGS. 4, 5, the charging system 100 may notably include an ionization chamber 101 designed to generate first cations. Additional elements of the system 100 are discussed in detail in sect. 2.1.

Moreover, a dual energization unit 140 (e.g., including electrical and optical controllers) is coupled to the antenna sets 130 and is generally configured to energize such sets 130 of antennas, in order to perform EUV radiation emission cycles as described above. Namely, first cations are further ionized thanks to the field intensities achieved in the FE volumes 135 by optically exciting corresponding pairs of opposite antennas (first energization scheme), whereas the second cations accordingly obtained are forced to radiatively decay, by electrically stimulating antenna pairs of such sets 130 (second energization scheme), in order to generate EUV radiation. Note, the energization unit 140 shall preferably be designed so allow the first cations to be trapped in the FE volumes, such that the cations may be further ionized and forced to decay while still being trapped in the FE volumes.

The apparatus 1, 1a preferably includes a support structure 112 presenting a surface 114, on which are arranged the sets 130 of nanoscale antennas 131-134, as seen in FIGS. 2-5. The charging system 100 shall then be configured 102, 103, 108 with respect to the surface 114 to allow first cations generated with the charging system to reach said surface 114. The support structure 112 can advantageously be designed so as to be essentially permissive to an electromagnetic field applied therethrough (see FIGS. 2A, 3A) to trap S40 and further ionize S50 cations in the FE volumes 135.

Meanwhile, the structure 112 is further designed so as to essentially reflect the EUV radiation generated S60, in operation. As one understands from FIGS. 2A and 3A, EUV light that is isotropically generated at antennas at the level of the surface 114 may be partly reflected by this surface 114, to avoid losses into the support 112. Thus, the support structure 112 shown in FIGS. 2A and 3A can be regarded as a selective waveguiding medium, which contributes to the efficiency of the EUV generation and, incidentally, allows a compact design for the chambers 10, 10a.

Figure 2A:
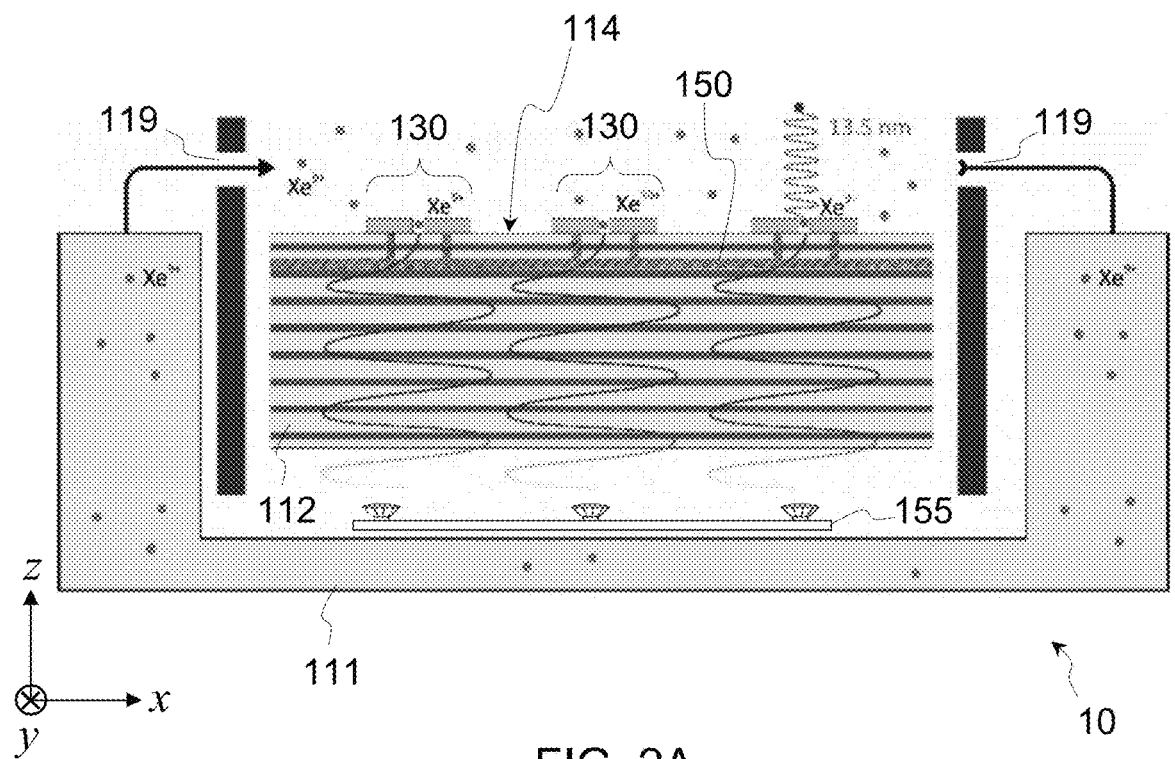
FIG. 2A is a 2D cross-sectional view of an EUV generation chamber of an EUV radiation apparatus according to embodiments.

In embodiments, the apparatus 1, 1a further includes an electromagnetic source 155 to electromagnetically excite antennas. The source 155 shall preferably be a light source adapted to emit visible light, as depicted in FIGS. 2A and 3A, as visible light can be used to both trap and excite ions, as discussed in sect. 1. The wavelength of the optical light is ideally resonant with the charge-distribution energies of the corresponding antennas. The source 155 may direct the light into the chambers 10, 10a, directly (via a free beam configuration), via an optical fiber or other optical elements such as lenses, as suggested in FIGS. 2, 3, to allow the primary optical source to be located outside the chamber. Antennas 131-134 can for instance be arranged on one side of the support 112 (on surface 114), whereas the light source 155 can be placed on the other side of the support structure 112, where it does not interfere with EUV photons trajectories. The support structure 112 may advantageously be realized as a layer stack of materials selected so as for the support structure 112 to be essentially permissive to visible light (to be able to trap and further ionize the first cations) and essentially reflecting EUV radiation generated S60, in operation.

The apparatus 1, 1a may for example include an electrical circuit 150 coupling an electrical controller of unit 140 to opposite antennas 131, 132 of the sets 130. Preferably, the circuit 150 is at least partly buried in the support structure 112, as depicted in FIGS. 2A, 3A. The second cations can be forced to radiatively decay by applying or modifying a voltage bias between opposite antennas 131, 132 of the sets 130, via the electrical controller and the electrical circuit 150, as explained earlier.

Note, only selected ones of the antenna sets 130 may be subject to a voltage bias (or a modification thereof). This way, one is able to select the spatial locations of the emitters to achieve a non-uniform EUV illumination pattern being emitted from the surface 114 (instead of a uniform illumination). Now, irrespective of the spatial distribution of multiple EUV emitters, one may seek to achieve a stable EUV (over time), as required in applications such as semiconductor lithography.

To that aim, a pulsed electrical operating mode synchronized with (or triggered by) the optical excitation may be desired, whereby, e.g., an AC bias is applied (or modified) to opposite antennas of two or more of the sets of antennas, at a given time after having applied the optical pulse. That is, the voltage bias is applied or modified in a time-synchronous manner with the optical pulse. The time lag between the optical excitation and the electrical pulse shall preferably be optimized (it will typically be very short), so as to optimize the optical flux. Antennas may indeed be connected so as to operate synchronously and yield highest flux, without spatial modulation). The voltage bias is otherwise simultaneously applied or modified across the sets of antennas, as discussed earlier. In variants, however, the optical excitation may be always on, while antenna may be electrically stimulated at time intervals.

As further seen in FIGS. 2A, 3A, the electrical circuit 150 shall preferably include one or more redistribution layers (RDLs) buried in the support structure 112. This way, a dense electrical addressing of the antennas can be achieved, notwithstanding the arrangement of antennas on the surface 114 and without hampering the latter. The connections from the antennas to the RDL are preferentially vertical in respect to the antenna surface layer. The RDL 150 is for instance placed at a depth at which the EUV radiation generated is entirely reflected by the substrates EUV reflection capability. In that respect, the devices 10, 10a may comprise a dense arrangement of individually controllable EUV radiation sources composed of antenna sets 130, wherein the sets 130 are distributed on the surface 114 of the support structure 112, e.g., to form a 2D array with given pitches along x and y directions, as in FIG. 3.

Finally, and as noted earlier, the sets 130 of nanoscale antennas 131-134 may possibly comprise, each, two pairs {131, 132}, {133, 134} of opposite antennas, wherein the two pairs define a single FE volume 135. The energization unit 140 and the circuit 150 may possibly be designed to selectively address sets 130 of antennas, as well as antenna pairs within selected sets, depending on whether such pairs are to be optically or electrically excited, as assumed in FIG. 1. E.g., on the one hand, light may be coupled to the two pairs of antennas, so as to be able to trap and further ionize the first cations by optically exciting such pairs {131-134}. On the other hand, the electrical addressing scheme 150 may be designed to bias only one pair {131, 132}, e.g., via buried RDLs, to force second cations to radiatively decay, in operation.

Referring now to FIGS. 3 and 5, a final aspect of the invention is described, which concerns a lithography apparatus 1a. The latter comprises an EUV source 10a such as described above, as well as a holder 220. The lithography apparatus is generally adapted to direct EUV radiation generated by the EUV source 10a toward the holder, so as to be able to pattern a UV-sensitive surface 212 of a material placed in or on the holder 220, in operation. Moreover, the lithography apparatus 1 is preferably configured 220 so as to move the EUV source 10*a* or part thereof relatively to the holder 220, so as to direct EUV radiation generated during a next cycle to another part of the UV-sensitive surface 212 and further pattern the latter, in operation. Preferably, a motorized stage is used. The apparatus 1*a* may further include a shield with one or more apertures designed to spatially constrain EUV radiation generated by the EUV apparatus, in operation. Such apertures are preferably located vis-à-vis the FE volumes 135. All this is discussed in more detail in sect. 2.2.

The above embodiments have been succinctly described in reference to the accompanying drawings and may accommodate a number of variants. Several combinations of the above features and variants may be contemplated. Examples are given in the next section.

2. Specific Embodiments—Technical Implementation Details

2.1 Field Enhancement Antennas

Preferred designs of antenna pairs are now discussed in detail, in reference to FIG. 6, which shows a 3D view of a single pair of antennas embedded in lateral, dielectric structures, and wherein a void is provided at outermost ends of the antennas, as in embodiments.

The antennas shown are processed by structuring a dielectric layer 1304. In practice, the antennas will typically extend on a substrate 1302 (making up the top of structure 112 and defining its surface 114, see FIGS. 2, 3). The antennas may possibly be covered, at least partly, by a second dielectric layer (not shown). Although termed 'layers', such dielectric layers are not necessarily plane. Similarly, the antennas and the substrate 1302 may be structured.

The materials used for the antennas may include, but are not necessarily limited to, metallic materials, semi-metallic materials, semiconducting materials, such as silicon (Si), poly-Si, amorphous-Si, or III-V compound semiconductors, dielectric materials, organic carbon-based materials, or 2D layered materials. A general prerequisite for high FE, however, is a sufficient number of free charge carriers to achieve collective oscillations thereof and consequently, high field concentrations inside the FE gap. As an alternative to high conductive metals or highly doped semiconductors, also dielectric materials are contemplated, which behave more like Mie resonators but may also achieve high FE in their near-field proximity. The substrate is preferably made of silicon, composition of silicon with intermediate metal content, superlattices of glass and metal, superlattices of semiconductor materials and metals, glass or quartz and the dielectric layers of oxides such as $SiO_2$. As the skilled person will appreciate, the substrate may further include sections of (tens to hundreds) molybdenum/Si layers such as built-in Bragg reflectors to direct the radiation in forward direction. Other EUV-reflective components may else be present.

The antennas are patterned on or from the first dielectric layer 1304. Opposite antennas are, in each of the pairs, separated by a gap g. This gap is measured along direction x, which is parallel to the main plane of the substrate 1302, as indicated in FIG. 6. The gaps defined between antennas of each pair impacts the field enhancement (FE) volume 135: the FE volume 135 is defined between opposite antennas of each pair, thanks to the gap g provided between opposite antennas. The antennas are configured such that electro-magnetic radiation can be concentrated in each volume 135 accordingly defined. This, as discussed in sect. 1, allows an ion 5 to be optically trapped and further ionized, via opposite antennas of each pair, in operation.

The dimensions of the FE volumes 135 is determined by the gaps g, together with the thicknesses (measured perpendicularly to the substrate, along direction z) of the antennas and the width of their apex (measured parallel to y). One may want to minimize the gaps g, in order to minimize the volume 135 and maximize the FE. Thus, the gaps g formed between antennas of each pair shall preferably be between 1 and 50 nm and more preferably be between 1 and 20 nm (all intervals mentioned herein are closed intervals). Yet, gaps meant to be used for electron tunneling shall preferably be less than 3 nm, to allow electron tunneling from one antenna to the opposite one.

Such gaps may possibly be constant from one set 130 to the other, in which case they do not appreciable vary from one pair or set to the other, subject to, e.g., ±0.1 nm, owing to the preferred fabrication methods as contemplated herein. The pairs of antennas may all be geometrically identical, though this is not a strict requirement.

Figure 3A:
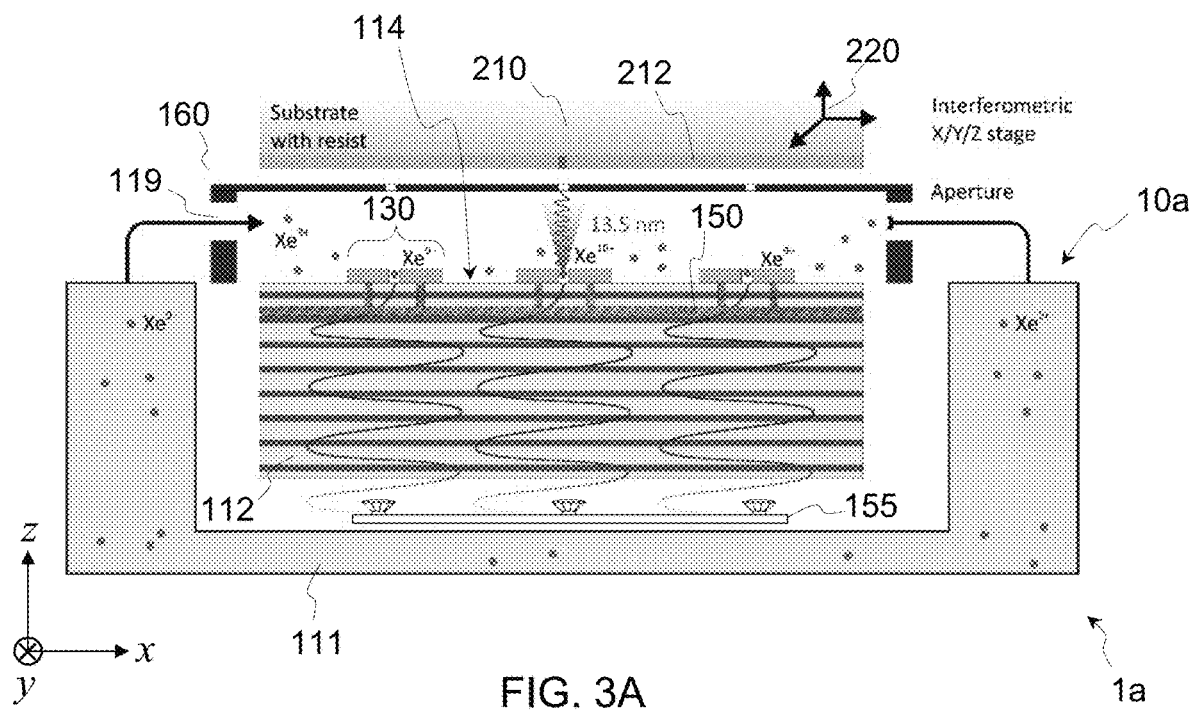
FIG. 3A is a 2D cross-sectional view of an EUV radiation lithography apparatus, according to embodiments. The lithography apparatus includes a generation chamber similar to that of FIG. 2, except the latter involves a dense arrangement of antenna sets distributed on a surface of a support structure of the chamber.
Figure 3B:
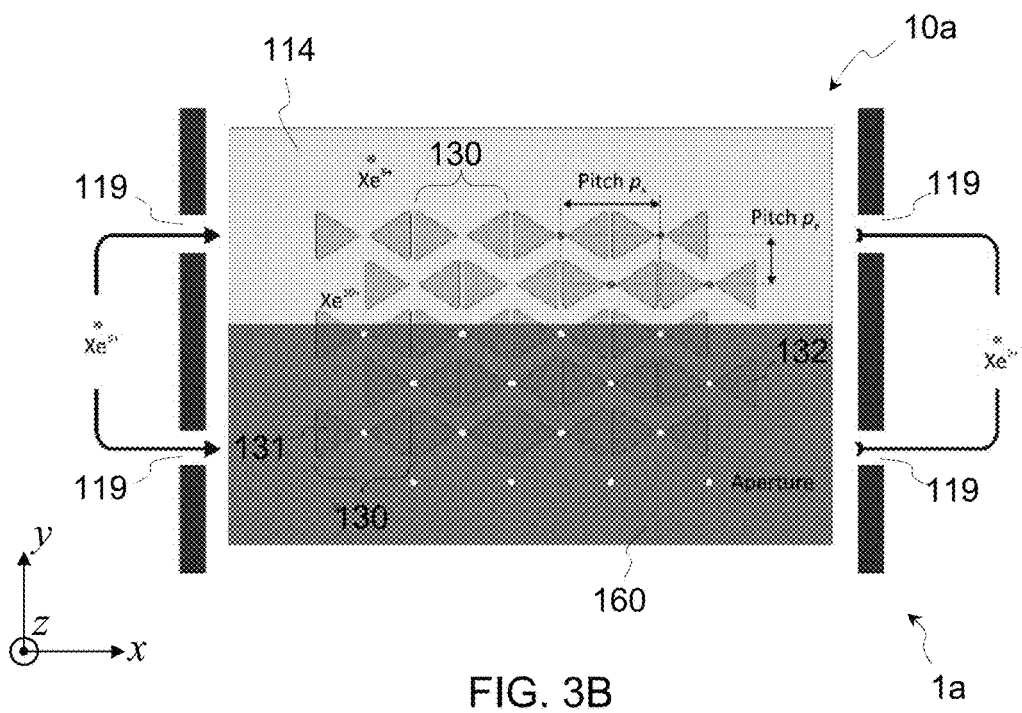
FIG. 3B is a corresponding top view.

One of the present Inventors has contributed to develop fabrication methods that make it possible to achieve well-defined, nanometer-ranged gaps g between antenna elements. In particular, such fabrication methods can, here, be exploited to obtain antenna arrangements with reproducible gap sizes as shown in FIG. 3B. Thanks to such fabrication methods, the dimensions of some key structures can be markedly reduced, to allow strong field enhancement at the limit of plasmonic strengths. As a result, and owing to their very small dimensions, the FE volumes 135 formed between opposite antennas allow unparalleled concentration of electro-magnetic radiation into sub-diffraction volumes. Moreover, this approach allows electrical gating capabilities, not strongly interfering with optically excited charge-carrier distributions. Such fabrication methods are described in U.S. patent application Ser. Nos. 15/681,371 and 15/249,916.

The pairs of antennas may all have a same length. Note, this length pertains to antenna pairs rather than antennas (halves) themselves. This length is measured between outermost ends of the opposite antennas of each pair, i.e., along axis x in FIG. 6. The length of an antenna pair defines the optical resonance conditions for this pair to achieve FE. Yet, various geometrical factors may be adjusted, in order to be able to tune the optical resonances of the antenna pairs individually and to address subsets of antenna pairs separately to allow for spatial variations of the ionization properties. The antenna elements 131, 132 may possibly have a same length (within each pair), though this is again not a strict requirement. I.e., opposite antennas within a given pair may possibly have different lengths (as measured along axis x). More generally, antenna elements may have distinct geometries within a pair. Having asymmetric antennas (with respect to the gap g along the axis y) allow more flexibility for tailoring the resonances and higher-order charge distributions. Notably, this makes it possible to further tune the optical resonance and, this, over a wider range, e.g., when relying on high-order or non-linear modes. Furthermore, asymmetric antennas can be tailored to harness specific polarization states of the incident light (e.g., circularly polarized or azimuthally polarized light). In simpler variants, however, the antennas are symmetrically shaped with respect to the axis y of the channel, as assumed in FIGS. 2-6. Doing so will normally ease the fabrication process, although the preferred fabrication methods evoked above allow, in principle, arbitrary shapes to be created.

In general, the antennas may have a given form factor. For example, in the embodiments of FIG. 6, the largest dimension of the antenna elements 131, 132 is parallel to direction x. Such a form factor makes it easier to achieve resonance conditions for charge-carrier excitation for a monochromatic excitation. More generally, the antennas may be shaped in various geometries, e.g., as rods, spheres, triangles, bowties, etc., or be tapered, straight, or curved, etc. following design rules for antennas and the different excitation geometries. I.e., each antenna element may be a more or less symmetrical object per se, just like each pair of antenna elements may be more or less symmetric with respect to the gap g.

The intra-pair gaps g enabled by the preferred fabrication methods allow very small FE volumes (small mode volumes) 135 to be achieved. Quantitatively, the volumes 135 defined between the antennas of each pair shall preferably be, each, between 1 $nm^3$ and $10^5$ $nm^3$. This stems from the fact that the two dimensions of the apex of the FE gap of the antennas may typically be between 1 to 50 nm. Thus, on the smaller end, a volume of approximately 1 $nm^3$ may be achieved, assuming a 1 nm gap g (measured along axis x), an average thickness of 1 nm for the antennas (measured along z), and an average antenna apex of 1 nm (measured along y). On the higher end, a volume of approximately $10^4$ $nm^3$ may possibly be achieved, assuming a 5 nm gap×50 nm thicknesses×40 nm width. As it may be realized, such volumes allow extreme field intensities and field gradient conditions to be achieved, in operation. By changing the gap dimensions, the FE to tune the ionization process and the tunneling current to force radiative decay, can be tuned and tailored to the desired EUV photon flux.

Preferably, lateral portions of the embedding structures 1304a are tapered, as seen in FIG. 6. This favors the insertion and propagation of ions in the channels defined by the gaps g, concentrates the electro-magnetic radiation to an even smaller volume and favors the interaction of the plasma with the FE volume.

As further seen in FIG. 6, the antenna core elements 131, 132 may only be partly embedded, laterally, in the surrounding dielectric structure 1304a, thanks to voids 1313 defined in a peripheral region of the antennas, i.e., between an edge of the antennas and a portion of the neighboring dielectric structure 1304a. This way, antennas can be partly isolated from the surrounding structures 1304a. The voids 1313 may for instance be defined at outermost ends of the antennas, with respect to the gap g separating them. The dielectric structure 1304a can extend to the gap of the structure to support its stability upon irradiation with optical light and generation of EUV photons that are also directly absorbed by the structure, providing substantial thermal load the antenna structure.

2.2 Preferred EUV Sources

Nanoscale antennas enable light to be concentrated and guided into sub-diffraction volumes. Coupling light into the FE volume of the antennas as well as coupling-out the light from the antenna into the far field can be controlled by design and material choice. In sub-10 nm gaps, molecules such as ions can be trapped by optical forces due to the high field intensities and field-gradients occurring in the volumes 135. Various non-linear effects can be achieved under high-field conditions. More importantly, the high electro-magnetic field intensities obtained with such nanoantennas can thus be leveraged to cause high-order ionizations of species such as $Xe^{9+}$ ions, as now discussed in detail. By electrically controlled electron tunneling between contacted antenna pairs via leads, the excited $Xe^{10+}$ ion is forced to decay radiatively to a $Xe^{9+}$ ion by donating one electron. The transition from $Xe^{10+}$ to $Xe^{9+}$ generates one EUV photon which is being emitting at the desired 13.5 nm wavelength to be used for EUV lithography.

Preferred methods to generate and control EUV radiation are based on the following processes:

Generation S30 of a $Xe^{9+}$-only plasma (gas) in an ionization chamber 101 sourcing the antenna chamber 10, 10a after passing appropriate filters to reject non-$Xe^{9+}$ species produced simultaneously;

Optional trapping S40 of $Xe^{9+}$ ions in the FE volume 135 of the antenna sets 130 by optical or static electromagnetic forces;

Ionization S50 of the $Xe^{10+}$ ions (present in the FE volume by trapping forces or spontaneous diffusion of the gas species into the FE volume) to higher charge-state $Xe^{10+}$ ions enabled by the strong electromagnetic field enhancements present in the FE volumes 135;

Forced decay S60 of the ionized $Xe^{10+}$ species to $Xe^{9+}$ ions by an electrical stimulus enabled by tunneling electrons across the electrically addressed FE volume 135 and concomitant emission S60 of a 13.5 nm EUV photon; and Release S70 of the $Xe^{9+}$ ion into the surrounding plasma (no trapping forces applied) or further dwelling of the $Xe^{9+}$ ion inside the FE volume 135 (trapping forces applied).

Such steps are generally described in sect. 1 and can be repeated to generate a high flux of EUV photons. Preferred components to enable the above-mentioned processes to be realized and controlled, are described in the following.

Figure 2B:
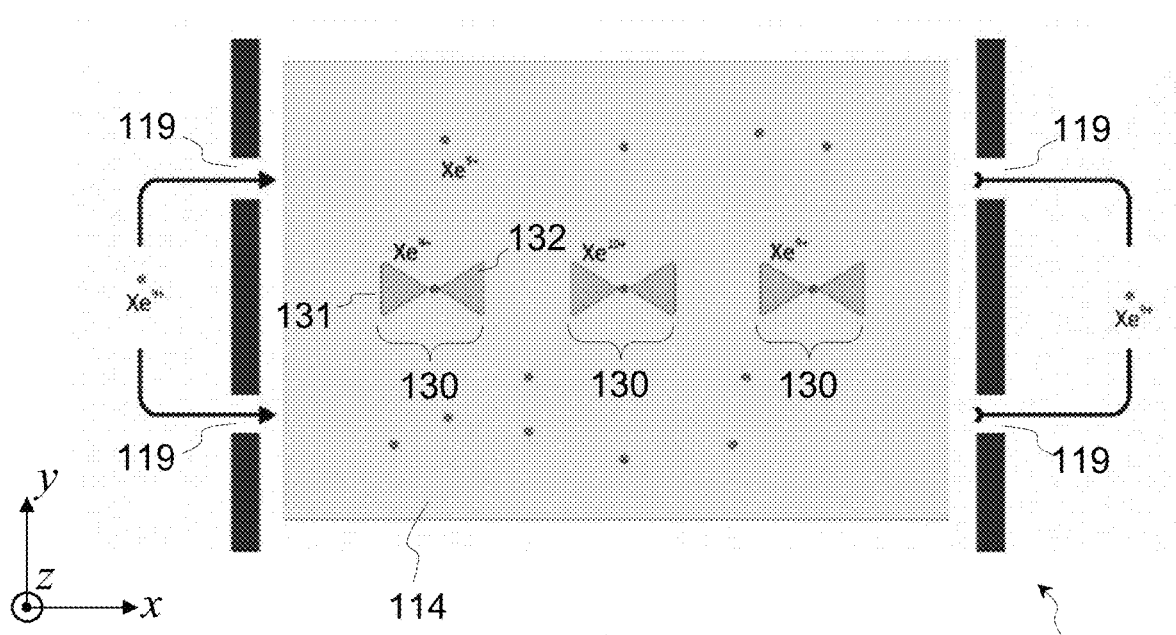
FIG. 2B shows a corresponding top view.

A preferred EUV radiation emission apparatus is depicted FIG. 2. This device includes:

A stack 112 of materials to reflect 13.5 nm radiation but transmit radiation in the visible to near IR regime (450-850 nm);

A light source 155 in the visible or near IR regime (500-800 nm);

Two (or more) nanoantenna sets 130 of defined geometries (bowties, rods, discs etc.), which do not stringently need to have the same geometries) and materials (e.g., metals, highly doped semiconductors, high-index conductive dielectrics, 2D layered materials, not stringently the same), where each antenna element may possibly be divided into multiple material segments, as discussed in sect. 2.1;

An energization unit 140 that allows an electro-magnetic field enhancement (FE) mechanism to generate FE volumes 135, where electro-magnetic radiation is concentrated;

An electrical addressing 150 of the nanoantenna pairs, relying on buried electrodes, e.g., inside redistribution layers (RDLs); and A plasma/ionic gas inside a chamber 111 connected to a pre-ionization chamber 100 with an ion-selective filtering system 102, 103, 108.

The antennas can be used to trap particles or molecular compounds, e.g., ionic species, in particular if they have a dipole moment or are charged, like ions as contemplated herein (optical tweezer effect). The charge-carrier distribution responsible for the near-field FEs of antennas can be made resonant to a specific wavelength of monochromatic incident light. Examples of monochromatic excitation of surface plasmon polaritons (SPPs) are examples. Using SPPs may help to disentangle the required mechanisms of trapping, ionization and radiative emission as its excited with narrow band light sources compared to broad-band illumination, e.g. no overlapping with EUV radiation. The present inventors have further realized that resonant antennas can be electrically addressed by adding leads to the antenna sections. If the rational design considers nodes of the charge carrier distribution (e.g., dipolar or quadrupolar), then such leads can be attached in a non-detrimental way regarding SPPs, which makes it possible to electrically bias a SPP-based FE antenna system.

Based on this, an innovative approach to generate EUV photons is proposed, which solves scalability issues of the current EUV sources and reduces their complexity and costs. Such approaches employ field-enhanced and electrically biased nanoantennas to (optionally) trap (by optical tweezer effects), ionize ions such as $Xe^{p+}$ or $Se^{q+}$ ions (by electromagnetic forces) into $Xe^{(p+1)+}$ or $Sn^{(q+1)+}$ ions, and electrically force radiative emission as discussed in sect. 1. The electrical stimulus, namely a tunneling current between the nanoantennas, can be controlled and forces the second cations to radiatively decay. Using $Xe^{9+}$ ions eventually leads to 13.5 nm radiation ideally suitable for EUV lithography. Additionally, local exposure of a nearby EUV-sensitive resist becomes feasible without the need of a rejection mask or a mirror system (see sect. 2.2). In addition, such approaches are debris-free as the ions do not leave the FE volumes 135 (in case of using trapping forces) and the number of local EUV sources can be scaled to a desired number to achieve a reasonable flux. This is also a great advantage compared to current EUV sources as it simplifies the design and reduces the operating costs of EUV lithography tools.

The ionization energy from a $Xe^{9+}$ to a $Xe^{10+}$ ion is approximately 200 eV. $Xe^{9+}$ needs approximately 17 times the energy needed to ionize a neutral Xe atom. The energy to remove the additional electron against the 9-fold charged core is provided by the oscillating electro-magnetic field produced by the antenna. The electric field needed to further ionize the $Xe^{9+}$ is on the order of 20 kV/cm, which can be practically achieved using nanoantennas such as described in sect. 2.1. Experimentally, even a static DC bias of 1.0 V can be non-detrimentally applied over a 1 nm gap-antenna, yielding electric field strengths up to $10^9$ V/m (or $10^7$ V/cm). By donating an electron to the $Xe^{10+}$ ion via a quantum tunneling process induced by applying a bias between the antenna's elements across the FE volume, the $Xe^{10+}$ ion is forced to radiatively decay. Both the optical excitation and the electric field frequencies can be on the order of GHz, therefore also the excitation/radiative decay would occur at such frequencies.

The following analysis illustrates the effectiveness of this promising concept. The number of antennas on the emitter substrate can be upscaled to achieve even high-flux conditions. Assuming a realistic distance of 200 nm between antennas (e.g. for optical excitation around 632 nm), an excitation frequency of 80 GHz results in a photon flux of approximately $2 \times 10^{20}$ photons/(s cm$^2$). With photons at a wavelength of 13.5 nm, this leads to 3 kW/cm$^2$ of radiation.

The system shown in FIG. 4 includes a plasma charging chamber 100, an EUV generation chamber 10 comprising a substrate 112 supporting nanoantennas, and a focusing and beam-shaping chamber 120, which may include a motorized stage that host wafers with UV-sensitive surfaces for exposure to EUV radiation.

The plasma charging component 100 is depicted in FIG. 4A. First, Xe ions are for example produced through a discharge (though other mechanisms can be contemplated). Ions of different species will expand at thermal velocity until they reach the aperture of the ionization chamber 101. The ions continue on their trajectories and pass through a cascade of spinning wheels 102. The wheels 102 include at least two coaxial discs, bored with holes at the same distance from their centers of rotation. The holes of the two or more spinning wheels 102 are axially slightly displaced, so that the virtual connection line of the holes forms a spiral with a given slope. Consequently, when the spinning wheels 102 spin, only ions with a given velocity manage to pass through the series of holes, whereas other ions impact on the discs. This first spinning wheel 102 is used to allow only ions with a given velocity or kinetic energy to pass while rejecting others. In addition to the energy-filtering functionality of the spinning wheels 102, also spatial filtering can be performed if the acceptance angle of the spinning wheels 102 is chosen in respect to the ion source size, the distance between the source and the aperture and the dimension of the aperture.

Only ions in a selected range of kinetic energies will pass the spinning wheels 102 and then enter the second filter 103. The latter involves an electric field applied between pairs of electrodes and an aperture to deflect the ions by electromagnetic (Lorentz) forces. The electric field is set such that only selected ion species escape the filter 103 without impacting on one of the constituting electrodes. This can be achieved by a single electric field perpendicular to the ion trajectory with a constant field strength or an electric field with a spatial gradient produced by multiple electrodes and more complicated ion trajectories but high-quality factor due to a higher selectivity. As the filter 103 generates an electric field, it is shielded through a Faraday cage, which restricts its influence on the ion motion to the inner volume of the filter 103. At the exit of the second filter 103 is placed an Einzel lens/unipotential lense 108, which consists of three or more pairs of cylindrical or rectangular apertures in series along an axis, generating an electric field gradient. The lens 108 focuses and decelerate the Xe ion beam on the substrate 112 inside the generation chamber 10. The 13.5 nm light eventually emitted from the chamber 10 is then guided into a conventional EUV focusing and beam shaping chamber 120.

An additional module may possibly be mounted between the array of nanoantennas 130 and the target wafer with the EUV-sensitive surface, e.g. a resist, if higher spectral purity is required by the application. In this module, the radiation is first reflected on a multilayer mirror and then passed through a thin film, for example made of Zr. This additional step would provide the photons in a ±2% bandwidth (BW), as required in some applications (e.g., a ±2% BW around 13.5 nm, for applications in EUV lithography).

However, since photons are here emitted by targeted ion recombination, the photons have a clean spectral distribution, with a predominant contribution in the EUV range even without the additional spectral purity filter. This is a further advantage with respect to known methods, which produces a thermalized plasma by emitting photons from the recombination of the highest charged ions down to lower charged ions, e.g. to the 1+ state.

The present approaches may be used to generate EUV light and to control its emission. Such approaches open new applications, such as, e.g., New EUV sources for high-volume manufacturing of semiconductors;

New EUV sources for metrology applications, i.e., to measure and detect possible defects at actinic wavelengths; and New EUV microscopes, to visualize structures optically in the domain of nm down to water window, which can be achieved using other materials than Xe ions.

A further application of a mirror- and maskless EUV lithography system is discussed in the next section.

2.3 Preferred Lithography Apparatuses

Beside the complicated optics for focusing EUV radiation and realizing expensive masks for patterning EUV-sensitive resists, it is currently assumed that the overlay accuracy may be another crucial factor for achieving the lithographic resolution for the next-node CMOS generations. The overlay accuracy is becoming an issue due the wafer warpage when operating with 300 or even 400 mm diameter substrates that have a finite surface flatness and mechanical rigidity. The local correction requires a wafer-specific, flexible and dynamic adaption of the mask for each lithographic exposure (or sub-exposure if stitching is done) based on local measurements, a crucial functionality that can only by hardly realized and at highest costs in contemplated mirror-based EUV masks if at all, as current approaches are only based on fixed-pattern EUV masks. As current lithography apparatuses do not offer dynamic mask correction mechanisms, multi-electron-beam lithography apparatuses are being reconsidered again, allowing for dynamic mask adaptions and local mark reading.

Here, novel EUV lithography apparatuses are proposed, which are based on multiple, spatially separated and individually triggerable EUV photon sources such as described in sect. 1 and 2.2. The lithography apparatuses discussed in the present section do not require any mirror or mask to operate and offers dynamic, tunable, mask-free lithographic opportunities. That is, such systems combine nanoscale antennas in a multiphoton, electrically programmable photon-source array, to achieve a novel concept of a write head for EUV lithography, which does not require any mirror or mask to operate.

The generation and control of EUV radiation is discussed in detail in sect. 2.2. In addition to steps discussed in sect. 2.2 (from the generation S30 of a $Xe^{9+}$ plasma to the release of the $Xe^{9+}$ ions), preferred lithography apparatuses enable additional processes, which include:

Forward-directed emission of the UV photons emitted from a multitude of nanoscale antennas towards an aperture array, where, e.g., an aperture is associated with (in vis-à-vis) a respective antenna;

Spatial and energetic filtering of UV photons via nanoscale apertures of arbitrary shapes; potentially configurable (on/off, size, transmission, shape);

Interaction of UV photons with a UV-sensitive resist (leading, e.g., to cross-linking of polymer chains in a negative tone resist or breaking of polymer chains in a positive tone resist or other photochemical or photothermal processes by the interaction of EUV photons with the chemical resist, including chemical amplification etc.);

Moving the stage to another exposure site to stitch the entire working field covered by the write head;

Repetition of above steps for each patterning spot of interest; and

Development of the resist using a suitable developer.

The above processes involve a multi-antenna array (FIG. 3A) where each antenna can be individually addressed, electrically, as described earlier.

Preferred components of the EUV lithography apparatus 1a are depicted in FIG. 3. The system 1a includes a charging chamber 100, a write unit 10a, and a target subsystem 210-220.

The write unit 10a is coupled to the charging chamber 100. The generation chamber 10a is similar to the chamber 10 of FIG. 4, except the chamber 10a is now configured as a write head. To that aim, the head 10a include a shield (filter) 160 with apertures (at least one per nanoscale antenna) located in front and close proximity of the FE volumes of antenna sets 130 of the array. I.e., each FE volume is associated to one aperture in vis-à-vis. The aperture has an average diameter that is preferably on the same order of magnitude as the gap g defining the FE volume.

The target subsystem 210-220 includes a substrate 210 (e.g., silicon) and a UV-sensitive resist 212, coated on the substrate 210, e.g., by spin-coating, atomic-layer deposition, CVD growth etc. In addition, this subsystem comprises a motorized XYZ stage (e.g., a laser interferometer stage with piezoelectric actuators capable of achieving sub-1 nm resolution).

The EUV-photon generation mechanisms described in sect. 2.1 are here expanded to an array of nanoscale antenna sets 130. Antenna pairs in the sets 130 can be addressed individually in the electrical domain, such that trapped $Xe^{10+}$ ions can emit either synchronously, e.g., to achieve a high flux or broad exposure, one after another, or individually—all single-photon emission events being electrically controlled. Locally emitted EUV photons can expose a nearby EUV-sensitive resist 212 without requiring a reflective mask or a mirror system, it being noted that the aperture array acts as a rejection mask. This is a stringent advantage compared to current EUV lithography approaches using fixed masks: the present concept simplifies the lithography apparatus drastically, reduces its fabrication and operating costs. This approach further provides outmost flexibility for mask designs and dynamic adaption upon lithographic exposures with tremendous advantages for local mask adaption, e.g. to achieve a high-overlay accuracy.

The EUV emission is based on electrically triggered radiative decays. Depending on the resonance conditions, antennas may follow simple scaling laws, with the length of antenna elements 131-134, e.g., bowties, being of approximately $\lambda/2$ for a dipolar excitation ($\lambda$ being the excitation wavelength, a correction is needed for the dielectric environment (the substrate)). Antennas for the visible regime (e.g., red laser light of 632 nm) have therefore a length of around 300 nm and can hence be packed with a pitch p of about 400 nm. Now, the pitches $p_x$ and $p_y$ (see FIG. 3B) may differ, depending on the antenna geometry and the unit cell used, which do not necessarily have to be bowtie antennas, contrary to the depictions of FIGS. 2, 3 and 6. If one antenna element is shared edge-to-edge (see FIG. 3B) between two hotspots, the pitch can for instance be of about $\lambda/2$ (e.g., 300 nm for red excitation). The next-neighbor row can be offset by a half-pitch to increase the packing density of bowtie or other longish antennas further. The high packing density may be favorable for excitation as an optical cross-talk inside the substrate can excite antennas collectively. Notably, as the EUV-photon emission is triggered electrically, the collective excitation is not detrimental for that operation.

The arrangement of EUV-emissive antennas determines the physical resolution of the emission pattern generated by nanoscale UV emitters. In practice, the size of the antenna array may be further limited by the electrical wiring scheme of each antenna (e.g., in a 3D-stacked structure) and the ion-loading mechanism of densely packed antenna arrays. To prevent local ion depletion in certain antennas due to constrained ion supply in close write head—substrate proximity, the write head can be loaded with ions remotely from the substrate before writing as the ions remain trapped and are not being consumed upon emission.

As transistor generations usually have a fixed design pitch and the critical dimension has to be achieved only in one dimension, the antennas can be placed in an arrangement that accounts for the design pitch to reduce stitching time/writing time via stage motion.

The write head's physical resolution is determined by the pitch p between nanoantennas sets, which is on the order of several 100 nm. Such a resolution is not sufficient for some applications. Additionally, the point-like emitters will be broadened at the substrate due to spatial dispersion along the path from excitation to resist interaction (typically a few 10s of nanometers). Hence, as in many e-beam or optical tools, a filter 160 with apertures is mounted between the antennas and the substrate (FIGS. 3, 5). The openings can have arbitrary shapes and will spatially constrain the UV photon beam to a few nanometers.

Notably, as UV light is generated from a single photon source in a coherent way, the openings can also be patterned in such a way that optical interference effects (with light originating from a single antenna) will take place. This can increase the resolution further and can leverage optical interference approaches as used already in DUV lithography, albeit much closer to the substrate. In addition, one may further exploit interference of light originating from different antennas.

The target subsystem 210-220 is mounted on a XYZ stage, e.g., capable of achieving 1 nm resolution. This allows the substrate to be moved and different patterns to be written by stitching the substrate and thereby compensating the large pitch between EUV emitters.

Patterning modes may for instance include: (i) discrete steps with intermediate beam off; and (ii) continuous exposure with beam on and moving stage (fixed beam moving stage), or combinations thereof. Each strategy has pros and cons, which depend on the application sought. For photonic crystals or larger structures, continuous exposure with beam yields stitch-free regions. As the photon source can be switched on and off in the 100 MHz frequency range, single pixel exposures can be much faster than in existing technologies given the fast shutter.

As each antenna can be addressed individually and the electric field varied (on the order of GHz), each pixel of the write unit 10a can be controlled. This provides a dynamic mask, able to vary patterns in contrast to fixed, rigid and cost-expensive reflective mask as currently contemplated for the next-generation EUV tools.

Dynamic masks can be key for the sub-10 nm node, in particular when it comes to overlay in multi-step processes as the wafer warpage has to be corrected. So far, none of the EUV tools can address this issue and smaller reticles/exposure areas have to be used, where uniform structures are located in an undisturbed design.

One drawback of nanoscale emitters may be the reduced photon flux compared to larger sources. Yet, the analysis made in sect. 2.1 illustrates that reasonable fluxes can be achieved with an array of single-photon emitters, which may very well compete with other EUV sources when it comes to broad exposure of larger structures. That is, a photon flux of $2\times10^{20}$ photons/(s cm$^2$) may for example be obtained with 13.5 nm photons, leading to 3 kW/cm$^2$ radiation.

The present approach offers a tremendous advantage with respect to known methods, as it is maskless, while still being able to expose a large region of the wafer to EUV light. This is made possible thanks to a multiplexing of the antennas and relative motion of the wafer with respect of the array, without going through the complex physical process of creating a quasi-continuous EUV emitting plasma. Beyond their use for EUV mirror- and maskless EUV lithography apparatuses, such techniques can further be applied to design novel EUV dynamic mask systems for lithography or local corrections, or for 3D printing.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

What is claimed is:

1. A method for generating extreme ultraviolet radiation, or EUV radiation, the method comprising:
   providing an extreme ultraviolet radiation device, or EUV device, comprising one or more sets of nanoscale antennas designed for electromagnetic field enhancement, wherein the one or more sets comprise, each, at least one pair of opposite antennas separated by a gap defining a field enhancement volume, or FE volume, thereby forming one or more FE volumes, respectively; and
   allowing first cations to reach the FE volumes and energizing the one or more sets of antennas, so as to perform one or more EUV radiation emission cycles, wherein:
      the first cations are further ionized thanks to electromagnetic field intensities achieved in the FE volumes by optically exciting corresponding pairs of opposite antennas, whereby second cations are obtained, which have a higher charge state than the first cations; and
      the second cations are forced to radiatively decay, by electrically stimulating antenna pairs of the one or more sets of antennas, whereby EUV radiation is generated and third cations are obtained, which have a lower charge state than the second cations.

2. The method according to claim 1, wherein
   the first cations are allowed to reach the one or more FE volumes and the one or more sets of antennas are energized so as to perform several EUV radiation emission cycles.

3. The method according to claim 2, wherein allowing the first cations to reach the one or more FE volumes further comprises, during one of the cycles:
   trapping the first cations in the one or more FE volumes, thanks to electromagnetic field intensities and field gradients obtained in the one or more FE volumes by optically exciting corresponding pairs of opposite antennas, whereby, subsequently, the first cations are further ionized and the second cations forced to decay while being trapped in the one or more FE volumes.

4. The method according to claim 3, wherein:
the third cations are trapped in the one or more FE volumes; and
the method further comprises, during one of the cycles and after having forced the second cations to radiatively decay in said one of the cycles, releasing the third cations as they are still trapped in the one or more FE volumes for them to be able to potentially reach any of the FE volumes, in view of a next one of the cycles.

5. The method according to claim 3, wherein:
the second cations are forced to radiatively decay so as to obtain third cations that have a same charge state as the first cations; and
the method further comprises, during one of the cycles and after having forced the second cations to radiatively decay in said one of the cycles, maintaining the third cations in the FE volumes, in order to start a next one of the cycles.

6. The method according to claim 1, wherein
forcing the second cations to radiatively decay is achieved by applying or modifying a voltage bias between opposite antennas of at least one of the one or more sets, so as to tunnel one or more electrons through the corresponding FE volumes and thereby trigger a radiative decay of the second cations.

7. The method according to claim 1, wherein, during each of said one or more EUV radiation emission cycles:
optically exciting said corresponding pairs of opposite antennas is achieved by applying an optical pulse thereto; and
forcing the second cations to radiatively decay is achieved by applying or modifying a voltage bias between opposite antennas of two or more of the sets of antennas in a pulsed operating mode, whereby said voltage bias is simultaneously applied or modified across said two or more of the sets of antennas, at a predetermined time after having applied said optical pulse.

8. The method according to claim 1, wherein
the method further comprises generating the first cations and allowing the generated cations to reach a surface of the device, on which the one or more sets of antennas are arranged, in view of allowing the first cations to reach the FE volumes.

9. The method according to claim 1, wherein
the first cations comprise one of $Xe^{p+}$ and $Sn^{q+}$ ions, where $5 \leq p \leq 11$ and $7 \leq q \leq 12$.

10. The method according to claim 1, wherein
the first cations are further ionized by optically exciting pairs of opposite antennas so as for the charge state of the second cations obtained to exceed a charge state of the first cations by one charge unit, and the third cations that have a same charge state as the first cations.

11. The method according to claim 10, wherein
the first cations essentially comprise $Xe^{9+}$ ions, and during each of the cycles:
said corresponding pairs of opposite antennas are optically excited such that the second cations obtained essentially comprise $Xe^{10+}$ ions; and
the second cations are forced to radiatively decay essentially into $Xe^{9+}$ ions, so as to generate an EUV radiation having an average wavelength of 13.5 nm.

12. The method according to claim 1, wherein,
in the EUV device provided, the sets of nanoscale antennas comprise, each, two pairs of opposite antennas, wherein the two pairs define a single FE volume.

13. The method according to claim 12, wherein,
during each of the cycles, the further ionization of the first cations comprises optically exciting antennas of a given one of said two pairs of antennas, whereas the second cations are forced to radiatively decay by electrically stimulating antennas of another one of said two pairs.

14. The method according to claim 1, wherein
the method further comprises directing EUV radiation generated during said one of the cycles to a given part of a UV-sensitive surface to pattern the latter, which completes one of the cycles.

15. The method according to claim 14, wherein
the one or more sets of antennas are energized so as to perform several EUV radiation emission cycles, and
the method further comprises, upon completing said one of the cycles, moving the EUV device with respect to said UV-sensitive surface and directing EUV radiation generated during a next one of the cycles to another part of the UV-sensitive surface, in order to further pattern the latter.

16. An extreme ultraviolet radiation apparatus, or EUV apparatus, wherein the apparatus comprises:
one or more sets of nanoscale antennas designed for electromagnetic field enhancement, wherein the one or more sets comprise, each, at least one pair of opposite antennas separated by a feedgap volume, thereby forming one or more FE volumes, respectively;
a charging chamber system, configured to allow first cations to reach the FE volumes; and
a dual energization unit, coupled to the one or more sets of antennas and configured to energize such sets of antennas, so as to perform one or more EUV radiation emission cycles, wherein, in operation:
the first cations are further ionized thanks to electromagnetic field intensities achieved in the FE volumes by optically exciting corresponding pairs of opposite antennas with said dual energization unit, whereby second cations are obtained, which have a higher charge state than the first cations; and
the second cations are forced to radiatively decay, by electrically stimulating antenna pairs of such sets, whereby EUV radiation is generated and third cations are obtained, which have a lower charge state than the second cations.

17. The EUV apparatus according to claim 16, wherein:
the apparatus further comprises a support structure, the one or more sets of nanoscale antennas arranged on a surface of this support structure; and
the support structure is designed so as to be essentially permissive to an electromagnetic field applied therethrough to carry out the further ionization of the first cations in the feedback volumes and essentially reflecting the EUV radiation generated, in operation.

18. The EUV apparatus according to claim 17, wherein
the apparatus further includes a light source adapted to emit visible light, and the support structure includes a layer stack of materials selected so as for the support structure to be essentially permissive to such visible light, in order to be able to carry out the further ionization of the first cations in the FE volumes, and essentially reflecting EUV radiation generated, in operation.

19. The EUV apparatus according to claim 17, wherein
the apparatus further comprises an electrical circuit coupling the energization unit to opposite antennas of each of the one or more sets, the circuit at least partly buried in the support structure, such that the second cations can be forced to radiatively decay by applying or modifying, via the energization unit and the electrical circuit, a voltage bias between opposite antennas of at least one of the one or more sets, so as to tunnel one or more electrons through the corresponding FE volumes and thereby trigger a radiative decay of the second cations, in operation.

20. The EUV apparatus according to claim 19, wherein said electrical circuit includes one or more redistribution layers buried in the support structure.

21. The EUV apparatus according to claim 17, wherein the charging chamber system comprises an ionization chamber designed to generate the first cations, the charging chamber system being otherwise configured with respect to the surface of the support structure to allow first cations generated with the charging system to reach said surface.

22. The EUV apparatus according to claim 17, wherein the apparatus comprises several of said sets of nanoscale antennas, the sets distributed on the surface of the support structure of the apparatus.

23. The EUV apparatus according to claim 16, wherein, in the EUV apparatus provided, at least some of the sets of nanoscale antennas comprise, each, two pairs of opposite antennas, wherein the two pairs define a single FE volume, and
the energization unit is coupled to:
one of the two pairs of antennas of each of the sets, so as to be able to further ionize the first cations by optically exciting said one of the two pairs and,
another one of the two pairs of antennas of each of the sets, so as to force the second cations to radiatively decay by electrically stimulating opposite antennas of said another one of the two pairs, in operation.

24. An extreme ultraviolet radiation lithography apparatus comprising:
an extreme ultraviolet radiation apparatus, or EUV apparatus, wherein the apparatus comprises:
one or more sets of nanoscale antennas designed for electromagnetic field enhancement, wherein the one or more sets comprise, each, at least one pair of opposite antennas separated by a feedgap volume, thereby forming one or more FE volumes, respectively;
a charging chamber system, configured to allow first cations to reach the FE volumes; and
a dual energization unit, coupled to the one or more sets of antennas and configured to energize such sets of antennas, so as to perform one or more EUV radiation emission cycles, wherein, in operation:
the first cations are further ionized thanks to electromagnetic field intensities achieved in the FE volumes by optically exciting corresponding pairs of opposite antennas with said dual energization unit, whereby second cations are obtained, which have a higher charge state than the first cations; and
the second cations are forced to radiatively decay, by electrically stimulating antenna pairs of such sets, whereby EUV radiation is generated and third cations are obtained, which have a lower charge state than the second cations; and
a holder,
wherein,
the lithography apparatus is adapted to direct EUV radiation generated by the EUV apparatus during one or more of the cycles toward the holder, so as to be able to pattern a UV-sensitive surface of a material placed in the holder, in operation.

25. The lithography apparatus according to claim 24, wherein the lithography apparatus
further comprises a shield with one or more apertures designed to spatially constrain EUV radiation directed toward the holder, in operation, and
is further configured to move the holder with respect to the shield.

* * * * *